(12) United States Patent
Kodoi et al.

(10) Patent No.: US 8,785,110 B2
(45) Date of Patent: Jul. 22, 2014

(54) LIQUID EJECTION HEAD AND METHOD OF MANUFACTURING THE SAME

(71) Applicant: Canon Kabushiki Kaisha, Tokyo (JP)

(72) Inventors: Takuma Kodoi, Kawasaki (JP); Yasunori Takei, Tokyo (JP); Kenji Yabe, Yokohama (JP); Isamu Horiuchi, Yokohama (JP); Hyou Takahashi, Kunitachi (JP); Ken Ikegame, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/939,513

(22) Filed: Jul. 11, 2013

(65) Prior Publication Data
US 2014/0030659 A1    Jan. 30, 2014

(30) Foreign Application Priority Data
Jul. 25, 2012  (JP) .................................. 2012-164688

(51) Int. Cl.
*G03F 7/20*    (2006.01)
*B41J 2/16*    (2006.01)

(52) U.S. Cl.
USPC ......................................................... 430/320

(58) Field of Classification Search
None
See application file for complete search history.

(56) References Cited

U.S. PATENT DOCUMENTS

| | | | |
|---|---|---|---|
| 2006/0172227 A1* | 8/2006 | Shaarawi et al. | 430/311 |
| 2012/0086750 A1* | 4/2012 | Hamade | 347/20 |
| 2013/0266901 A1* | 10/2013 | Ikegame et al. | 430/320 |

FOREIGN PATENT DOCUMENTS

JP    2001-264637 A    9/2001

* cited by examiner

*Primary Examiner* — John A. McPherson
(74) *Attorney, Agent, or Firm* — Fitzpatrick, Cella, Harper & Scinto (57) ABSTRACT

A liquid ejection head is manufactured by forming a dent representing a substantially spherical profile so as to include a position for forming an ejection port on a surface of a photosensitive resin layer, then forming a latent image of the ejection port in the dent by an exposure treatment using a projection lens system, and developing the latent image. The center of the top surface of the latent image is shifted to the incoming side of the beam of exposure light from the lowest point of the dent.

12 Claims, 10 Drawing Sheets

◯ EXPOSURE IMAGE FOR EJECTION PORT

◯ EXPOSURE IMAGE FOR EJECTION PORT

LIQUID EJECTION HEAD AND METHOD OF MANUFACTURING THE SAME

BACKGROUND OF THE INVENTION

1. Field of the Invention

The present invention relates to a method of manufacturing a liquid ejection head.

2. Description of the Related Art

Known liquid ejection heads for ejecting liquid include ink jet recording heads to be used for ink jet recording systems. Ink jet recording heads generally include one or more ink channels, ejection energy generating elements arranged at a part of the ink channel or each of the ink channels to generate energy for ejecting ink and minute ink ejection ports for ejecting ink.

For example, a method as described below is known for manufacturing such an ink jet recording head. Firstly, a mold of an ink channel is formed on a substrate, which contains heater elements formed therein in advance, by means of a photosensitive material and then a coating resin layer that becomes a channel forming member is formed to coat the channel mold. Thereafter, ejection ports are formed in the coating resin layer. Then, a manufactured ink jet recording head comes out as the photosensitive material that has been used for the mold is removed. With this manufacturing method, flow channels, ejection ports and so on can be formed by way of high precision micro processing steps because a photolithography technique that is being used in the field of semiconductors is also employed for the method. This manufacturing method involves exposure to light by a semiconductor exposure apparatus that operates as means for setting a photosensitive resin material. The photosensitive resin material is exposed to light by way of a reticle having a desired profile and by means of a semiconductor exposure apparatus. The part of the photosensitive resin material that is shaded and hence not exposed to light remains unset and is removed in a subsequent removal step.

Figure 10:
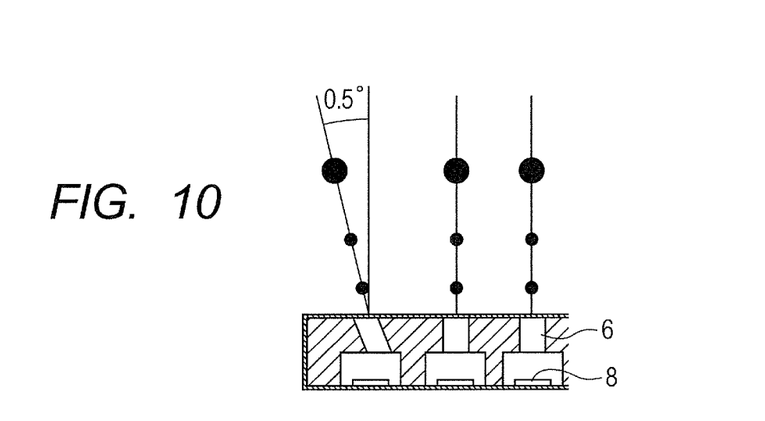
FIG. 10 is a schematic cross-sectional view of ejection of liquid droplets of a liquid ejection head manufactured by a known manufacturing method.

In recent years, there is a tendency of using long chips in order to realize high-speed printing. There is also a tendency of exposing collectively a plurality of chips to light from the viewpoint of reducing the time required for the exposure step. For these reasons, a pattern is arranged nearly to the limits of the angle of view of the reticle to be used for the exposure step. If such is the case, the rays of light that are transmitted through a portion of the projection lens system representing a large curvature in a semiconductor exposure apparatus are affected by the aberrations of the lens to by turn adversely affect the profiles of the ejection ports. Such a phenomenon occurs because, when the rays of light coming from the exposure apparatus are so adjusted that the pattern formed at and near the center of the reticle may be accurately projected on the resist, the rays of light irradiated from the semiconductor exposure apparatus are refracted to inward directions of the lens in regions remote from the center of the reticle. Differently stated, there arise instances where a pattern is formed at and near the limits of the angle of view of the reticle for stepper exposure and the ejection ports 6 that correspond to the parts exposed to the rays of light that have passed at and near the limits of the angle of view represent an outwardly inclined profile (see FIG. 10).

In view of the above-identified problem, Japanese Patent Application Laid-Open No. 2001-264637 disclosed means for correcting the aberrations of the lens of a lens system. The means lies in an ingeniously devised lens system. With such a means, a spherical aberration correcting optical system is mounted in the inside and the spherical aberration is corrected by moving the movable lens group of the system in the directions of the optical axis.

SUMMARY OF THE INVENTION

According to the present invention, there is provided a method of manufacturing a liquid ejection head by forming an ejection port forming member for configuring an ejection port for ejecting liquid by using a photosensitive resin layer on a surface of a substrate, the method including: (1) a step of forming a dent representing a substantially spherical profile in a region including the position for forming the ejection port on a surface of the photosensitive resin layer; (2) a step of forming a latent image corresponding to the ejection port in the dent by way of an exposure treatment using a projection lens system; and (3) a step of producing the ejection port by developing the latent image; the latent image being formed by a beam of exposure light refracted by the projection lens system and inclined from the direction perpendicular to the surface of the substrate in the exposure treatment in the above-described step (2); the center of a top surface of the latent image being shifted to the incoming side of the beam of exposure light from the lowest point of the dent.

Further features of the present invention will become apparent from the following description of exemplary embodiments with reference to the attached drawings.

DESCRIPTION OF THE EMBODIMENTS

While the aberrations of a lens system can be corrected by ingeniously devising the lens system as described in Japanese Patent Application Laid-Open No. 2001-264637, a desired and accurate lens system can hardly be prepared in a short period of time. The difficulties that an attempt of preparing such a lens system encounters are obvious when the process time for meeting the requirements of the lens system to be used for each product, the amount of investment for such a novel lens system and the maintainability of such a lens system are taken into consideration.

Figure 9:
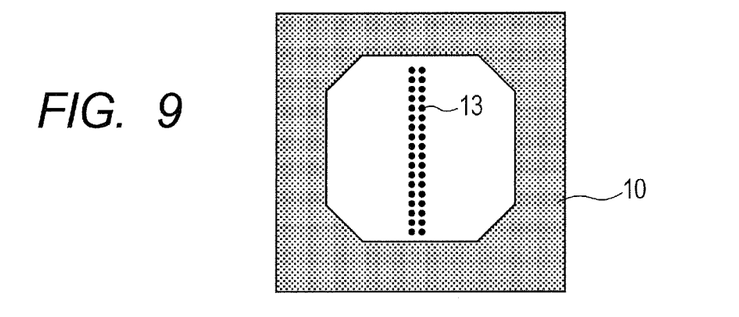
FIG. 9 is a schematic plan view illustrating the configuration of the reticle used in an examination of an embodiment of the present invention.

Meanwhile, for manufacturing a liquid ejection head, there is a known step of forming ejection ports by exposing the photosensitive resin film formed on a silicon wafer to light by means of the stepper of a semiconductor exposure apparatus, using a reticle 10 having a pattern of ejection ports 13 as illustrated in FIG. 9 and described earlier. In this process, while the rays of exposure light that pass through the center and its vicinity of the projection lens system for exposure to light enter perpendicularly into the photosensitive resin film, the rays of exposure light 5 that pass through a portion of the projection lens system that is located near the edge thereof and represent a large curvature in the semiconductor exposure apparatus are refracted due to aberrations and enter aslant into the photosensitive resin film (see FIGS. 1B and 1C). Then, as a result, the rays of light that are refracted at the edge portion of the lens system strike the resist (photosensitive resin film) for exposure in directions inclined from the direction perpendicular to the substrate front surface (i.e. the surface on which the photosensitive resin film is formed) so that inclined ejection ports are formed in that portion. As inclined ejection ports are formed, the printing operation of the liquid ejection head can be adversely affected by such ejection ports. Such inclined ejection ports are produced particularly when a reticle is exploited to near the limits of the angle of view thereof such as when long chips are manufactured and when a plurality of chips are arranged side by side for exposure.

In view of the above-identified problem, the object of the present invention is to provide a method of manufacturing a liquid ejection head that can suppress the inclinations of ejection ports in areas where exposure light enters aslant under the influence the aberrations of a projection lens system.

Now, embodiments of the present invention will be described below by referring to the accompanying drawings. In the following description given by referring to the accompanying drawings, the components having the same functions are denoted by the same reference numerals and will not be described repeatedly in some instances. While the following description is given in terms of manufacturing a liquid ejection head of an ink jet recording apparatus, the description equally applies to manufacturing a chip or a circuit in a similar manner by means of a semiconductor exposure apparatus.

Firstly, an exemplary configuration of an ink jet recording head to which the present invention is applicable will be described.

Figure 1A:
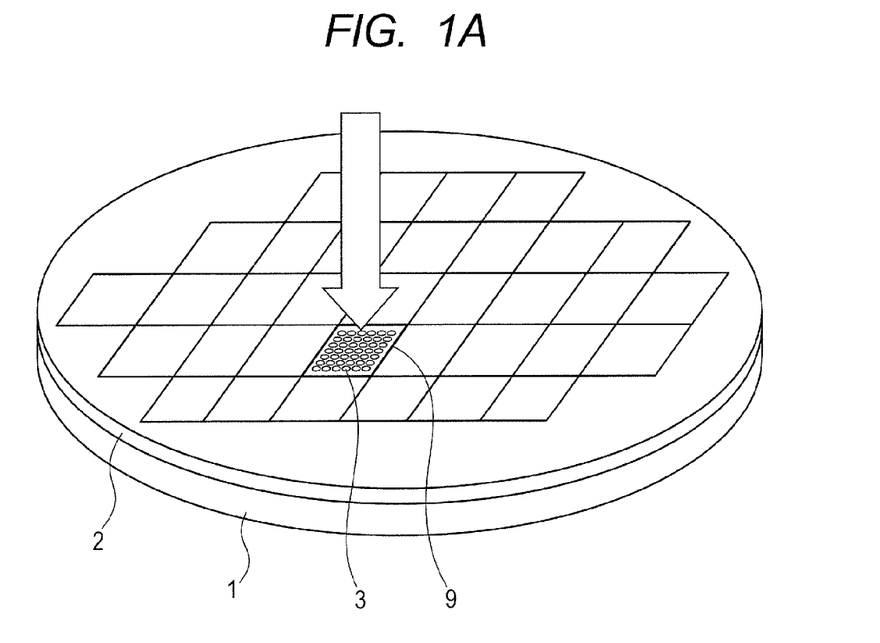
FIG. 1A is a schematic illustration of a step of an embodiment of manufacturing method according to the present invention.
Figure 1B:
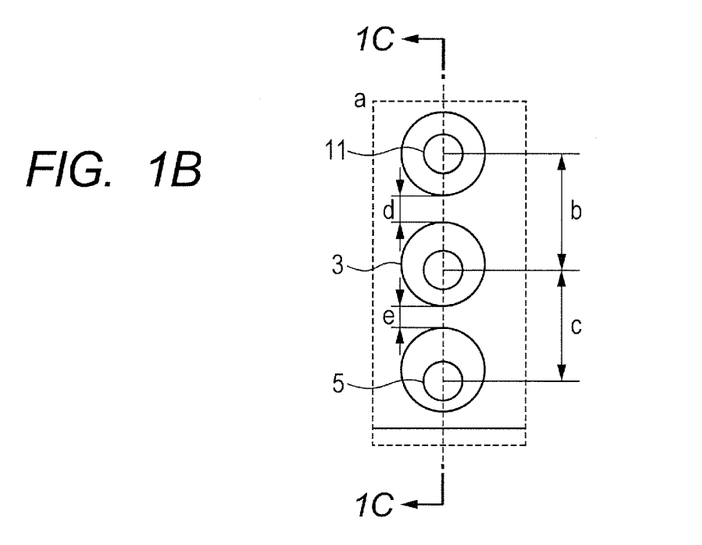
FIGS. 1B, 1C and 1D are schematic cross-sectional views illustrating the exposure step of an embodiment of manufacturing method according to the present invention.
Figure 1C:
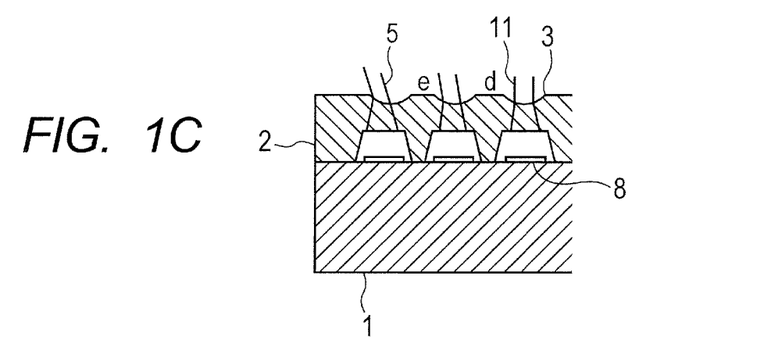

A liquid ejection head to be manufactured by a method according to the present invention includes a substrate 1 in which ejection energy generating elements 8 that generate energy for ejecting ink are arranged at a predetermined pitch (see FIG. 1C). An ink supply port for supplying ink to an ink channel is cut between the two rows of ejection energy generating elements 8, which may be heater elements, arranged in the surface of the substrate 1. An ejection port forming member 2 for forming ejection ports 6 is formed on the front surface (to be referred to merely as "the surface" in the below) of the substrate by means of a photosensitive resin layer (see FIG. 1D). The ejection port forming member 2 includes a plurality of ejection ports 6 that are open at the tops thereof and arranged above the respective ejection energy generating elements 8. An ink channel that communicates with ink supply ports and the ejection ports 6 may also be formed in the ejection port forming member 2.

Figure 8:
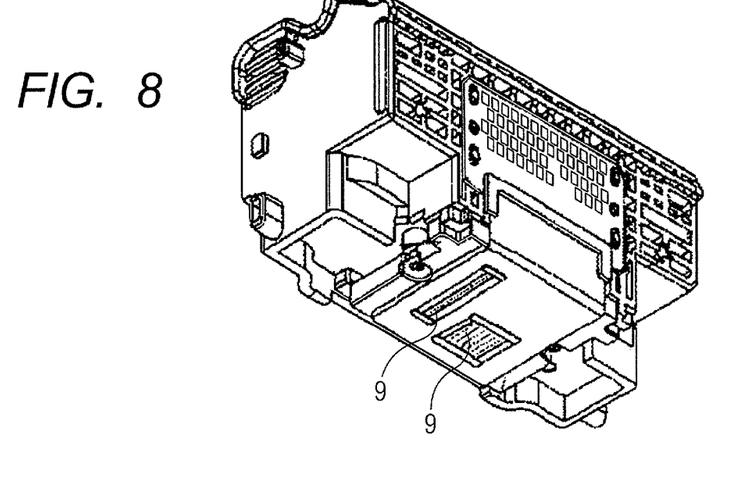
FIG. 8 is a schematic perspective view illustrating an exemplary configuration of an ink jet recording head.

A liquid ejection head is so arranged that the ejection port surface thereof where a plurality of ejection ports 6 are formed faces the recording surface of a recording medium (see chip 9 in FIG. 8). Then, as the pressure generated by the ejection energy generating elements 8 is applied to the ink filled in the ink channel by way of the ink supply ports, the liquid ejection head ejects ink droplets from the ejection ports 6. An image is recorded as the ejected ink droplets are forced to adhere to the recording medium.

Now, an embodiment of method of manufacturing a liquid ejection head according to the present invention will be described below.

With this embodiment of the present invention, an ejection port forming member for forming ejection ports that eject liquid is prepared by means of a photosensitive resin layer.

For example, a channel mold is formed on a substrate 1, which may be a silicon wafer and in which ejection energy generating elements 8 such as heater elements are arranged, and then a photosensitive resin layer is formed so as to cover the channel mold. Thereafter, an exposure treatment and a development treatment are conducted on the photosensitive resin layer to produce an ejection port forming member that has ejection ports arranged above the respective ejection energy generating elements 8.

Negative type photosensitive resin may typically be used for the photosensitive resin layer. Examples of negative type photosensitive resin that can suitably be used for the purpose of the present invention will be described hereinafter. Examples of techniques that can be used for forming the photosensitive resin layer include spin coating, roll coating and slit coating.

While a mode of arranging a pattern (channel mold) that provides a mold of channel is mainly described herein, the use of a technique that does not use a channel mold is also included in the present invention.

If necessary, an ink repellent agent layer may be formed on the photosensitive resin layer by means of a negative type photosensitive resist. Examples of application techniques that can be used for forming an ink repellent agent layer include spin coating, roll coating and slit coating. When an ink repellent agent layer is to be provided, the resin of the ink repellent agent layer and that of the ejection port forming member are preferably not unnecessarily miscible with each other because the resin of the ink repellent agent layer is formed on the negative type photosensitive resin layer while the latter is still unset.

Figure 7A:
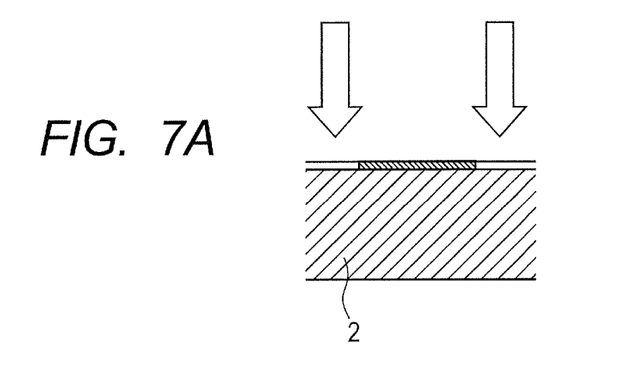
FIGS. 7A, 7B, 7C and 7D are schematic cross-sectional views illustrating an embodiment of manufacturing method according to the present invention.
Figure 7B:
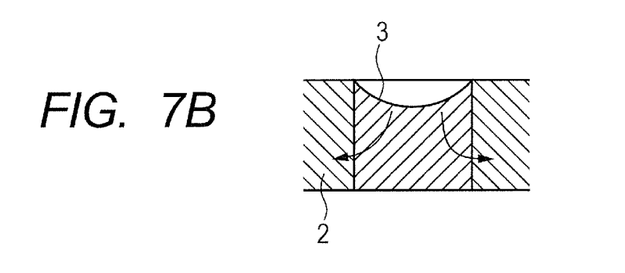

Then, a dent 3 is formed for each ejection port 6 in a region including the position for forming the ejection port 6 on the surface of the photosensitive resin layer (see FIG. 7B). The dent 3 can be formed by executing an exposure operation and a baking operation to an extent of not opening the ejection port by using a reticle or a photomask.

Now, the step of forming a dent will be described in detail by referring to FIGS. 7A through 7D. Firstly, a portion of the photosensitive resin layer that surrounds the position of the dent 3 is exposed to light to an extent of slightly setting that portion as illustrated in FIG. 7A. The extent of exposure to light at this time is about 1,500 to 2,500 J/m$^2$. Thereafter, a dent 3 representing a substantially spherical surface profile as illustrated in FIG. 7B is produced by baking that portion at about 60 to 120° C.

The profile and the position of the dent 3 can be appropriately selected according to the characteristics required to the liquid ejection head to be manufactured. More specifically, the profile and the position of the dent can be adjusted by appropriately defining the shape of the pattern of the mask or the reticle to be used for forming the dent. Additionally, the depth of the dent 3 can be adjusted by appropriately selecting the extent of exposure to light, the temperature and the duration of the heat treatment or the film thickness of the channel forming member.

When the dent is cut along a plane perpendicular to the running direction of the rows of ejection ports, the cross section of the dent typically represents a circular arc, an elliptic arc, a catenary or the like. In a plan view of the substrate, or when the substrate is observed from right above, the dent 3 typically represents a circular or elliptic boundary line.

Figure 7C:
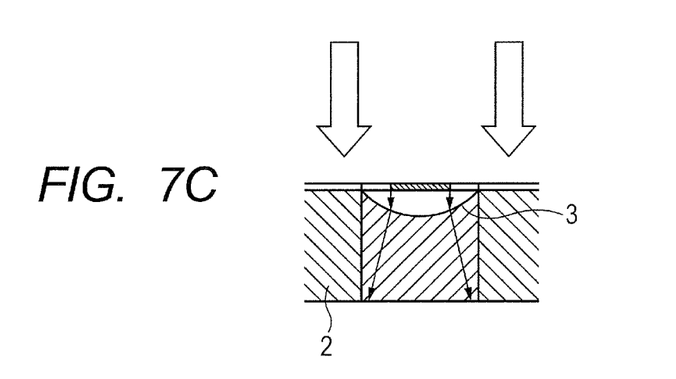
Figure 7D:
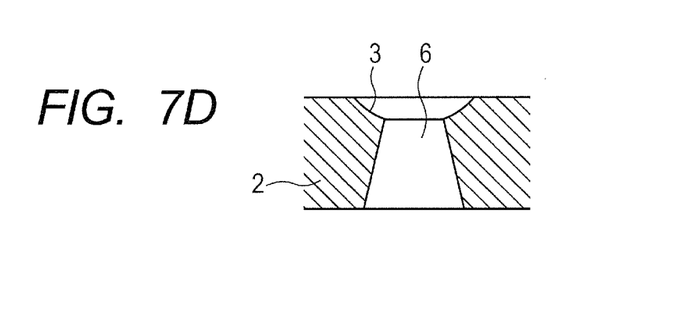

Thereafter, as illustrated in FIG. 7C, the negative type photosensitive resin layer is subjected to a pattern exposure operation by way of a mask. Subsequently, as illustrated in FIG. 7D, the negative type photosensitive resin layer is subjected to a development treatment to produce the ejection port 6. The ejection port 6 is formed with a taper angle due to the concave lens effect of the dent 3.

Figure 4:
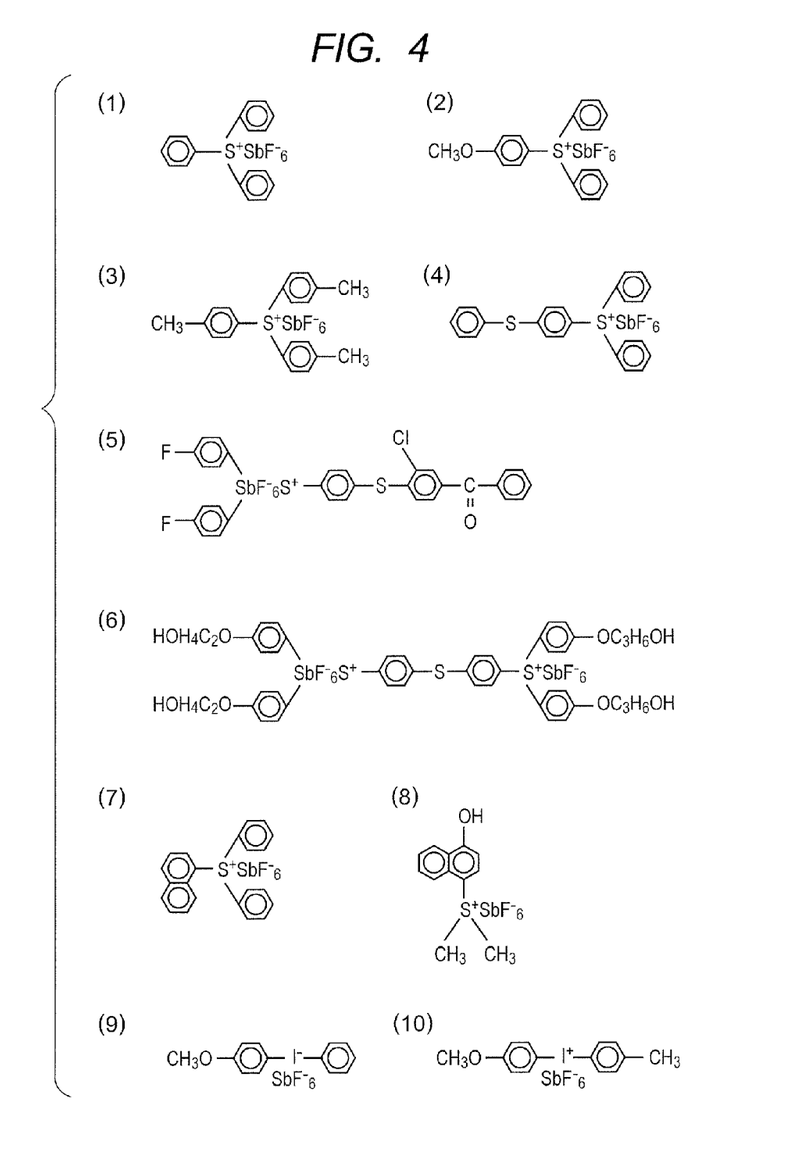
FIG. 4 schematically illustrates exemplary compounds that can be used for photosensitive resin in an embodiment of the present invention.
Figure 5:
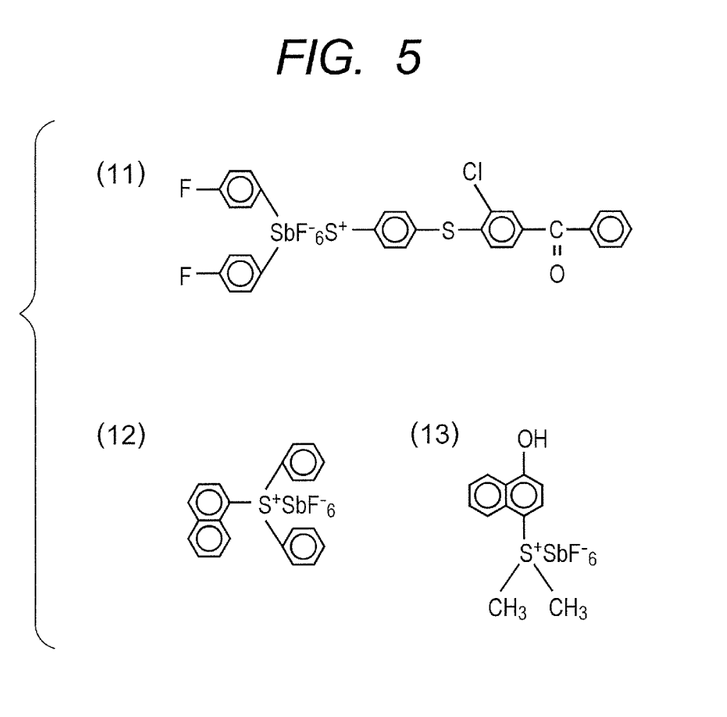
FIG. 5 schematically illustrates additional exemplary compounds that can be used for photosensitive resin in an embodiment of the present invention.

A photocationic polymerization type epoxy resin composition is preferably employed for the negative type photosensitive resin when the mechanical strength of the set resin as structure material, the ink-resistance of the resin in a recording head, the resolution and so on are taken into consideration. Particularly preferable examples of such composition include photocationic polymerization type epoxy resin compositions based on bis-phenol A type epoxy resins, phenol novolak type and cresol novolak type epoxy resins and multifunctional epoxy resins having an oxycyclohexane skeleton. The epoxy equivalent of any of such epoxy compounds is preferably not greater than 2,000 and more preferably not greater than 1,000. This is because an improved crosslink density is realized at the time of setting reaction and the obtained photosensitive resin tends to become excellent in terms of tight adhesion and ink-resistance when the epoxy equivalent is not greater than 2,000. Examples of photocationic polymerization initiators that can be used for setting such epoxy resins include aromatic sulfonium salts and aromatic iodonium salts. Initiators containing antimony as an anionic component are preferably employed because such initiators provide an excellent reactivity. Examples of photocationic polymerization initiators containing antimony include the compounds expressed by the formulas (1) through (10) in FIG. 4 and the formulas (11) through (13) in FIG. 5. Photocationic polymerization initiators containing antimony provide an excellent polymerization effect relative to epoxy resins and the reaction products (set products) thereof represent excellent physical properties. The photosensitive wavelengths that are required to realize cationic polymerizations are found within a relatively short wavelength region. For this reason, a relatively high photosensitivity can be obtained when light with a wavelength not longer than 300 nm is employed for a patterning operation. In a photocationic polymerization process of an epoxy resin, cations (generally protons) deriving from the photocationic polymerization initiator that is put into the polymerization system are generated when light is irradiated onto the polymerization system so that a chain reaction of ring-opening of epoxy groups and polymerization proceeds. Thus, a polymerization reaction proceeds to a great extent with a slight quantity of light energy to make the negative type photosensitive resin extremely highly photosensitive. The photosensitive wavelengths (the wavelengths that cause reactions for generating cations to take place) of the photocationic polymerization initiators illustrated in FIG. 4 are mainly within a shortwave region not longer than 300 nm. On the other hand, the compounds illustrated in FIG. 5 have respective photosensitive wavelengths extending to a relatively long wavelength region. Therefore, when i rays (365 nm) that are popular in terms of the wavelengths of exposure apparatus designed for photolithography are irradiated, the compounds illustrated in FIG. 5 function well as negative type resists.

While the method of forming the dent 3 that is currently being described employs exposure to light and baking, the present invention is by no means limited to that method and other appropriate methods can also be used to form dents for the purpose of the present invention. Examples of such methods include a method of mechanically applying pressure to the layer for forming dents.

The dent 3 can be formed not only by the above-described method of using a photolithography step, as noted above, but also by some other method such as an imprint method. Now a technique of forming a dent 3 by means of an imprint method will be described below. With an imprint method, a dent pattern can be transferred onto a negative type photosensitive resin layer by pressing a molding original plate (to be simply referred to as mold hereinafter) having a convex pattern that corresponds to the dent to be transferred against the negative type photosensitive resin layer. Conditions in which the mold is pressed against the negative type photosensitive resin layer typically include a mold temperature range between 20 and 120° C. and a pressure range between 0.01 and 5 MPa. With a popular imprint method, the mold is heated to a temperature higher than the glass transition temperature of the resin onto which the pattern is to be transferred and the pattern is transferred under pressure of several MPa. However, in the instance that is being described here, the aspect ratio of the pattern is small and the dent pattern does not need to be transferred deep into the negative type photosensitive resin layer so that the pattern operation can be conducted at a relatively low temperature with relatively low pressure. Examples of base materials that can be used for the mold include various metal materials, glass, ceramic materials, silicon, quartz, plastic materials and photosensitive resin materials.

Now, an embodiment of the present invention will be described in detail by referring to the related drawings.

As described earlier, a beam of light that has passed through the projection lens system of a semiconductor exposure apparatus (e.g., a focusing exposure apparatus for image-size reducing projection and exposure) near the edge of the system is refracted toward the center than a beam of light that has passed through the projection lens system at or near the center of the system. As the photosensitive resin layer is exposed to such a refracted beam of light, a latent image of an ejection port is formed so as to be directed to the direction of the incoming beam of light. Then, there may be an instance where the formed ejection port is outwardly directed.

Figure 2A:
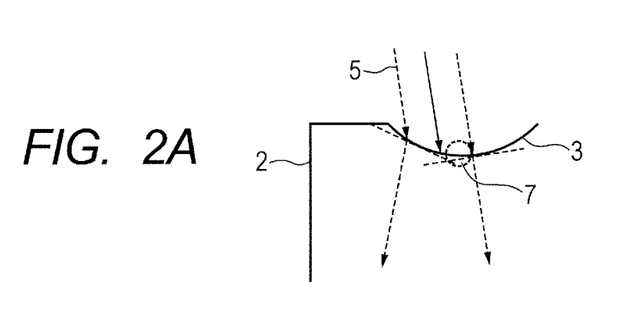
FIGS. 2A, 2B, 2C and 2D are schematic cross-sectional views illustrating the exposure step of an embodiment of manufacturing method according to the present invention.

In view of this possibility, with this embodiment, an exposure treatment operation for forming a latent image of an ejection port in a dent 3 using the projection lens system is conducted such that the center of the top surface of the latent image is shifted from the lowest point of the dent toward the side at which a beam of light enters for exposure (see FIG. 2A). In other words, with this embodiment, a substantially spherical dent is formed in a region that includes the position at which an ejection port is to be formed on the surface of a photosensitive resin layer. Thereafter, a latent image that corresponds to an ejection port is formed in the dent by means of an exposure treatment using a projection lens system. In the exposure treatment operation, the latent image is formed by a beam of exposure light that are refracted by the projection lens system and inclined from the direction perpendicular to the substrate surface such that the center of the top surface of the latent image is shifted from the lowest point of the dent toward the side from which beam of light enter for exposure.

The exposure treatment of this embodiment will be described in greater detail below by referring to FIGS. 2A through 2D. FIGS. 2A through 2D schematically illustrate the relationship between a refracted beam of exposure light 5 and the latent image obtained by means of the beam of exposure light 5. They also illustrate the positional relationship between the center of the top surface of the latent image to be obtained and the lowest point 7 of the dent 3. In each of FIGS. 2A through 2C, the arrow of a solid line indicates the center of the beam of exposure light 5 that enters the dent.

With this embodiment, the photosensitive resin layer 2 is exposed to light such that the center of the beam of exposure light 5 that has been refracted by a projection lens system is shifted toward the direction of incoming light (the side from which the beam of exposure light enter the dent 3) relative to the lowest point 7 of the dent 3. With such an exposure arrangement, the angles formed by the ejection port lateral surface and the substrate surface can be made equal to each other at the transversal opposite ends of the ejection port in a cross section taken along a plane that passes through the center of the top surface of the latent image and the lowest point of the dent and stands perpendicularly relative to the substrate surface.

Figure 1D:
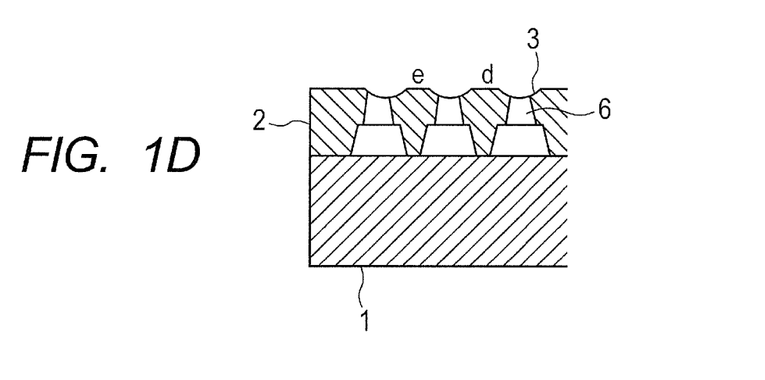

Then, an ideal head profile as illustrated in FIG. 1D can be obtained by conducting an exposure treatment such that the center of the beam of exposure light 5 (the center of the top surface of the latent image) that has been refracted by the projection lens system is shifted toward the direction of the incoming beam of light relative to the lowest point 7 of the dent so as to make the angle formed by the ejection port lateral surface and the substrate surface to be substantially the same at the opposite ends of each and every one of the ejection ports in a cross section taken along a plane that passes through the center of the top surface of the latent image and the lowest point of the dent and stands perpendicularly relative to the substrate surface so as to extend in the running direction of the row of ejection ports to which the ejection port belongs. In other words, the liquid ejection head that is obtained by means of the above-described exposure arrangement is such that the directions of the center lines of the ejection ports are made to be parallel to each other and the difference in the direction of ejection between the ejection ports located at and near the center of each row of ejection ports and those located at and hear the ends of the row is reduced to a large extent.

Figure 2B:
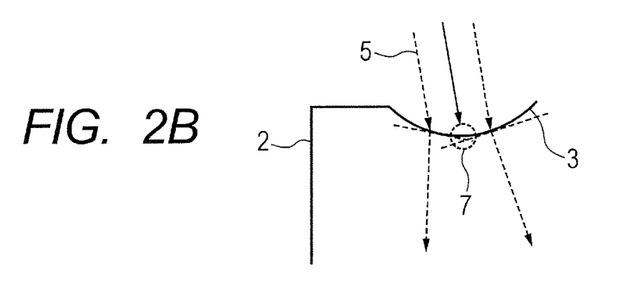
Figure 2C:
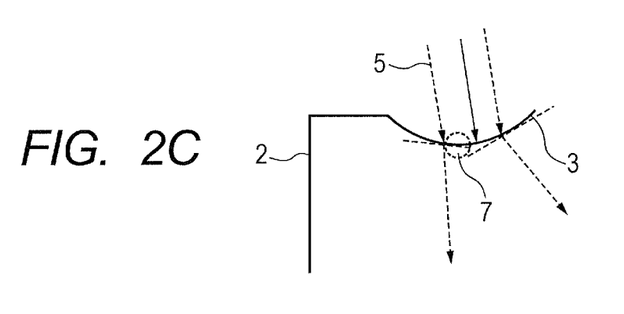

If, on the other hand, the center of the rays of exposure light and the lowest point 7 of each dent are made to agree with each other for each ejection port as illustrated in FIG. 2B, the direction of the center line of an obtained ejection port located near the edge of the photosensitive resin layer is inclined toward the direction of the incoming beam of light. Furthermore, if the center of the top surface of the latent image is shifted relative to the lowest point 7 of the dent toward the side opposite to the side of the incoming beam of light, the direction of the center line of the obtained ejection port is further inclined toward the direction of the incoming beam of light.

Figure 2D:
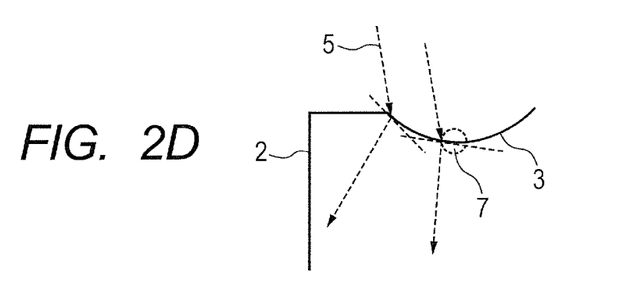
Figure 3A:
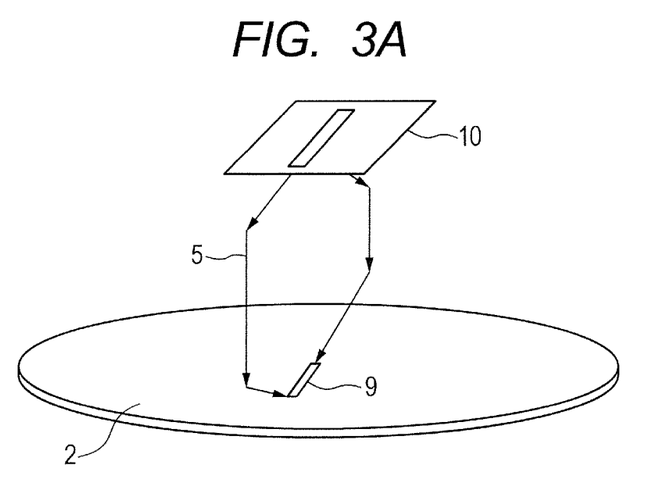
FIGS. 3A and 3B are schematic cross-sectional views illustrating the exposure step of an embodiment of manufacturing method according to the present invention.
Figure 3B:
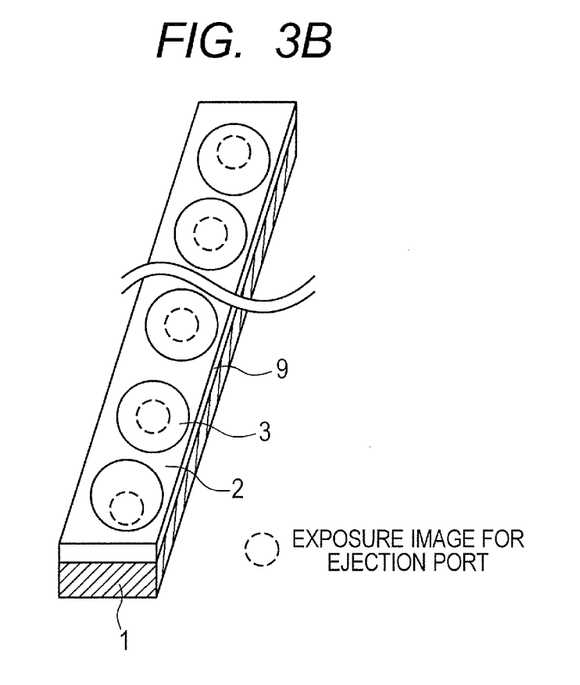

With this embodiment, the top surface of the latent image is preferably arranged so as to cover the lowest point of each and every one of the dents as viewed from right above. If, for example, the top surface does not cover the lowest point 7 of a dent as illustrated in FIG. 2D, the ejection port 6 can be inclined toward the side opposite to the side of the incoming beam of light.

With this embodiment, the positional relationship between the center of the dent and the center of the top surface of the latent image is desirably so adjusted that the angle that is formed by the lateral surface of the obtained ejection port and the substrate surface is substantially the same at the opposite ends of the ejection port in a cross section taken along a plane that passes through the center of the top surface of the latent image and the lowest point of the dent and stands perpendicularly relative to the substrate surface so as to extend in the running direction of the row of ejection ports to which the ejection port belongs. The difference of the taper angles at the opposite ends of the ejection port is preferably less than 0.5 degrees, more preferably less than 0.3 degrees, most preferably less than 0.1 degrees. When the difference is less than 0.5 degrees, the flying direction of liquid droplets of the ejection port can be regarded as being perpendicularly upwardly adjusted relative to the surface of the photosensitive resin layer if compared with an instance where no such correcting operation is conducted.

Now, an embodiment of the present invention will be described below by referring to FIGS. 1A through 1D.

FIGS. 1A through 1D schematically illustrate how an exposure operation is conducted when forming the ejection ports of a liquid ejection head with this embodiment. More specifically, a photosensitive resin layer 2 is formed on a substrate 1, which may be a silicon wafer, and dents 3 are formed on the surface of the photosensitive resin layer 2. Then, ejection ports 6 are formed in the respective dents 3.

Referring to FIG. 1A, a photosensitive resin layer 2 is formed on the surface of a substrate 1, which may be a silicon wafer, and a plurality of dents 3 representing a concave profile are formed and arranged in rows on the surface of the photosensitive resin layer 2.

The dents 3 may be so formed that they have a substantially uniform size in the rows of ejection ports and the gaps separating adjacent dents 3 may be reduced toward the ends of the rows of ejection ports. Differently stated, the dents 3 that are located near the opposite ends of the rows of ejection ports are shifted inwardly (toward the centers) of the rows. In FIG. 1A, reference numeral 9 denotes a block that functions as a chip. The substrate is cut and divided into a plurality of chips in a later step.

FIG. 1B is an enlarged schematic plan view of a part of a row of ejection ports (three ejection ports included in an end region a of a row) as viewed from above. FIG. 1C is a schematic cross-sectional view taken along line 1C-1C in FIG. 1B. Note that the lower end of FIG. 1B and the left end of FIGS. 1C and 1D are located close to one of the opposite ends of the row of ejection ports.

In FIGS. 1B through 1D, the following relations hold true for b, c, d and e, where b and c are the distances between the centers of adjacently located latent images and d and e are the distances between the oppositely disposed ends of adjacently located dents.

$$b \approx c, d > e$$

In FIGS. 1B through 1D, the centers of the rays of exposure light 5 for forming ejection ports (the centers of the top surfaces of the latent images) are separated by equal gaps. Additionally, the ejection ports 6 of each row of ejection ports are formed to represent the same positional relationship as the corresponding ejection energy generating elements 8.

The positional relationship between the lowest point of the dent and the center of the top surface of the corresponding latent image differs from ejection port to ejection port. In other words, among a plurality of latent images, the center of the top surface of a latent image is shifted from the lowest point of the dent to a great extent toward the side of incoming exposure light when the angle (incident angle) between the direction of the beam of exposure light striking the dent to form the latent image and the direction perpendicular to the substrate surface is large. FIG. 1C illustrates the relationship between the positions of dents and the beams of exposure light 5 respectively striking the dents and how the beams of exposure light 5 strike the respective dents. In a row of ejection ports 6 that are collectively exposed to light, as for the positional relationship between the lowest point of a dent and the center of the beam of exposure light for forming an ejection port there, the lowest point of the dent for forming an ejection port there is shifted to a great extent toward the center of the row from the center of the beam of exposure light for forming the ejection port (the center of the top surface of the latent image there) when the ejection port 6 is formed at a position located close to the outside (close to one of the opposite ends of the row). With such an exposure arrangement, the produced ejection ports of the row are directed perpendicularly upward (in the direction perpendicular to the substrate surface) in the row of ejection ports as illustrated in FIG. 1D due to the refraction effect of concave lens.

Now, the present invention will be described further below by way of examples.

The following negative type photosensitive resin was prepared:
  epoxy resin: EHPE-3150 (available from Daicel) 120 g
  photocationic polymerization initiator: SP-172 (available from ADEKA) 6 g
  intensifier: SP-100 (available from ADEKA) 1.2 g
  solvent: methyl isobutyl ketone 100 g The above materials were mixed to prepare negative type photosensitive resin. The negative type photosensitive resin was applied onto a quartz glass substrate to a film thickness of 1 μm and the absorbance of the negative type photosensitive resin layer was observed for light having a wavelength of 365 nm to find out that the absorbance was 0.024.

Firstly, a silicon substrate having heater elements (heaters made of material $HfB_2$) as ejection energy generating elements and a laminate film (not illustrated) of SiN+Ta at the site for forming a channel was prepared.

Then, positive type photosensitive resin (polymethyl isopropenyl ketone (ODUR: trade name, available from TOKYO OHKA KOGYO) was applied onto the substrate that includes ejection energy generating elements 8 by spin coating and baked at 150° C. for 3 minutes.

Thereafter, the positive type photosensitive resin was subjected to a patterning operation to produce a channel mold. More specifically, a pattern exposure operation was executed with an exposure dose of 23000 $mJ/cm^2$ by means of an exposure apparatus (Deep-UV Exposure Apparatus UX-3000 (tradename) available from USHIO. Then, a development process was executed by means of methyl isobutyl ketone and the pattern was subjected to a rinse treatment, using isopropyl alcohol, to obtain a channel mold having a channel pattern.

Subsequently, a negative type photosensitive resin layer 2 was formed on the substrate by applying the prepared negative type photosensitive resin onto the substrate by spin coating.

In the example, formation of an ink repellent agent layer was omitted.

At this stage, the negative type photosensitive resin layer 2 was subjected to a pre-exposure process and a baking process as described earlier to form dents 3 in respective regions, each of which includes the position at which an ejection port is to be formed on the surface of the photosensitive resin layer 2 (see FIGS. 7A and 7B).

Then, the negative type photosensitive resin layer was exposed to light to form latent images that correspond to respective ejection ports by means of the technique of this embodiment (which will be described in detail below) (see FIG. 7C). In the exposure treatment process, the negative type photosensitive resin layer was exposed to light with an exposure dose of 1000 $J/m^2$ by way of a photomask (not illustrated) and by means of an i rays stepper (available from Canon). Light having a center wavelength of 365 nm and a half width of 5 nm was used for the exposure treatment process.

Thereafter, the negative type photosensitive resin layer was baked on a hot plate at 90° C. for 180 seconds and then developed by means of methyl isobutyl ketone. After executing a rinse treatment process by means of isopropyl alcohol, the resin layer was subjected to a heat treatment process at 100° C. for 60 minutes to produce ejection ports 6 (see FIG. 7D).

Note that the above-described mixing ratio of the materials for preparing the negative type photosensitive resin is cited only as an example and the present invention is by no means limited to it. Additionally, note that formation of an ejection port with a taper angle due to the concave lens effect of a dent is preferable for the ejection performance of the ejection port and adopted because it provides a higher degree of freedom for selecting the taper angle if compared with an ejection port 6 made to represent a taper angle by shifting the focus position for defocusing at the time of exposure to light of the ejection pattern.

Now, the above-described exposure process for a method of manufacturing a liquid ejection head will be described below and Examples of the present invention will also be described in detail below.

EXAMPLE 1

Figure 6A:
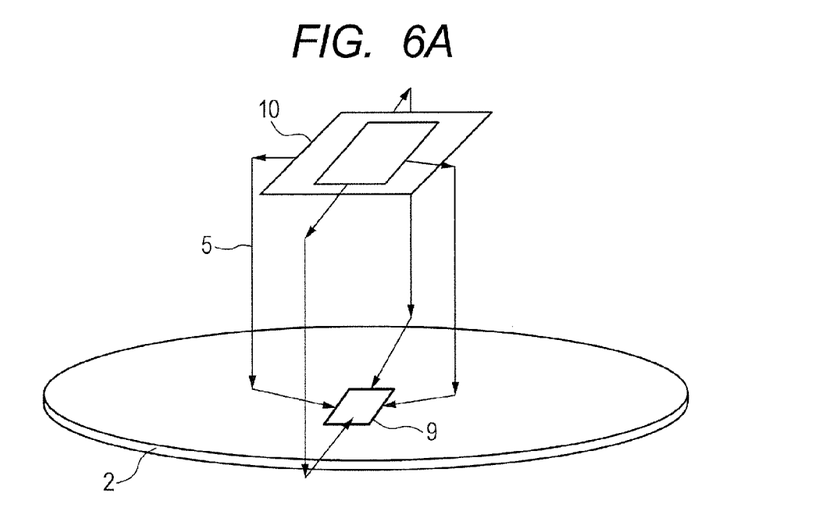
FIGS. 6A and 6B are schematic cross-sectional views illustrating the exposure step of an embodiment of manufacturing method according to the present invention.
Figure 6B:
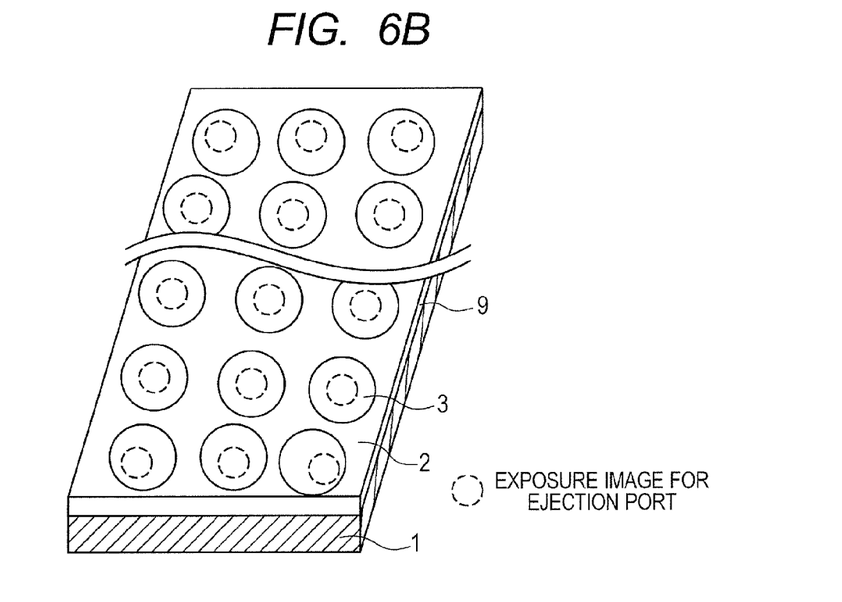

In this example, a 6-inch reticle 10 of a 5-times size reducing optical system as illustrated in FIG. 6A was used when forming latent images of ejection ports. The dimensions of the chip 9 to be prepared were such that the chip 9 had a longitudinal length of 26 mm and a transversal width of 2 mm. In other words, the length of the chip 9 agrees with the largest angle of view of the reticle to be used this time, which is 26 mm, so that the pattern 13 was arranged nearly to the limits of the angle of view as illustrated in FIG. 9. As for the chip 9, the density of ejection energy generating elements arranged at each side, or each row, was 600 dpi and the centers of two adjacently arranged ejection energy generating elements were separated by about 42 μm. Four dummy nozzles that were not to be used for printing and four dummy ejection energy generating elements 8 were arranged at the opposite ends of each row. The photosensitive resin layer 2 had a thickness of 28 μm and the thickness the orifice plate section for forming ejection ports 6 (the thickness not including the thickness of the foam chambers) was 12 μm.

Each ejection port was designed to have a diameter of 16 μm in order to cause it to eject about 5 pl and each dent 3 was designed to have a diameter of 35 μm. Firstly, about 4.4 μm-deep dents 3 were formed on the surface of the photosensitive resin layer 2 by way of exposure to light and baking under the above-described conditions. At and near the center of each row of ejection ports, the center of the beam of exposure light for forming an ejection port that struck the photosensitive resin layer without being refracted agreed with both the center of the corresponding dent 3 and that of the ejection port 6. The inverse taper angle of the ejection port 6 was 2.6 degrees at the opposite ends in a cross section taken along a plane that passes through the center of the top surface of the latent image and the lowest point of the dent and stands perpendicularly relative to the substrate surface so as to extend in the running direction of the row of ejection ports to which the ejection port belongs.

As for each of the ejection ports located at and near the opposite ends of each row of ejection ports, on the other hand, the center line of the ejection port becomes parallel to that of an ejection port located at or near the center of the row to produce an ideal head profile as illustrated in FIG. 1D when the center of the beam of exposure light 5 for forming the ejection port is shifted from the lowest point 7 of the corresponding dent 3 toward the side from which a beam of light enters for exposure. In other words, the directions of liquid ejection were made to agree with each other and a liquid ejection head representing the highest printing quality can be manufactured when the positional relationship as illustrated in FIG. 2A is established for the lowest point of the dent 3 and the center of the ejection port 6 for each of the ejection ports located at and near the opposite ends of each row of ejection ports.

Figure 11A:
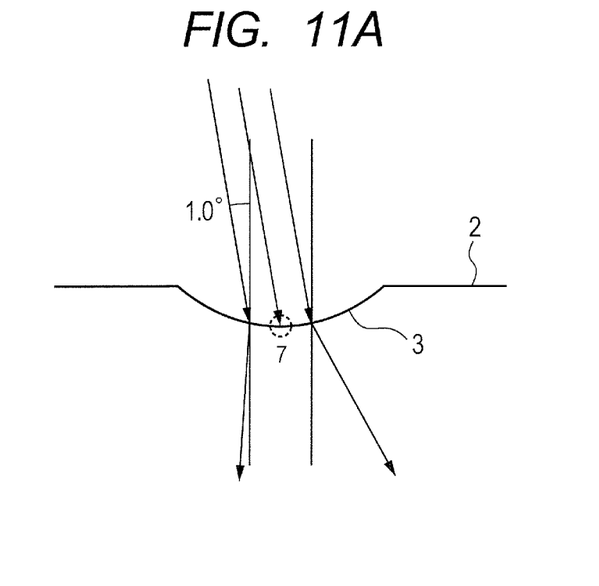
FIGS. 11A and 11B are schematic cross-sectional views illustrating the exposure step of an embodiment of manufacturing method according to the present invention.
Figure 11B:
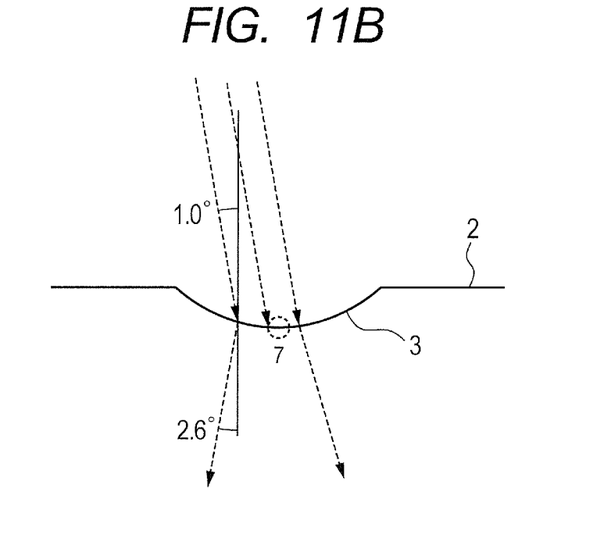

A liquid ejection head prepared in a study will be described below in detail with numerical values of the nozzles that were actually used for the study. When the beam of incident light was inclined by 1.0 degree from the direction perpendicular to the substrate surface and the lowest point 7 of the dent was made to agree with the center of the rays of light (the center of the top surface of the latent image to be formed) as illustrated in FIG. 11A (the positional relationship before a correction), the beam of light was refracted and entered the photosensitive resin layer at the dent 3. The lateral surface of the obtained ejection port 6 did not represent the same degree of inclination at the opposite ends of the lateral surface in a cross section taken along a plane that passes the center of the top surface of the latent image and the lowest point of the dent and stands perpendicularly relative to the substrate surface so as to extend in the running direction of the row of ejection ports to which the ejection port belongs. Therefore, the position of the dent 3 was shifted to the direction opposite to the direction along which the beam of light strikes the dent 3 relative to the center of the beam of exposure light. As a result, the taper angle was made equal to 2.6 degrees at the opposite ends of the lateral surface of the ejection port so that ejection ports 6 representing a uniform inverse taper angle can be obtained regardless of the degrees of inclination of the incident beams of light that were not equal to each other. Thus, ejection ports could be formed at and near the ends of the rows of ejection ports so as to be directed perpendicularly upward from the surface of the photosensitive resin layer just like the ejection ports formed at and near the center of the rows of ejection ports. The related values of the prepared samples that were obtained by actual measurements are listed in Table 1 below.

TABLE 1

| Refraction angle of incident beam of light (angle of inclination of beam of light from direction perpendicular to substrate surface) | Quantity of shift of center of latent image surface from lowest point of dent toward direction of inclination | Left side taper angle of ejection port | Right side taper angle of ejection port |
|---|---|---|---|
| 0.5° | 0.5 μm | 2.6° | 2.6° |
| 1.0° | 1.0 μm | 2.6° | 2.6° |
| 2.0° | 2.0 μm | 2.6° | 2.6° |

Thus, the present invention provides a method of manufacturing a liquid ejection head that can suppress the inclinations of ejection ports in areas where exposure light enters aslant under the influence the aberrations of a projection lens system.

The present invention is applicable not only to ordinary printing apparatus but also to various apparatus including copying machines, fax machines having a communication system and word processors having a printing section as well as to complex industrial recording apparatus realized in combination with various processing apparatus.

While the present invention has been described with reference to exemplary embodiments, it is to be understood that the invention is not limited to the disclosed exemplary embodiments. The scope of the following claims is to be accorded the broadest interpretation so as to encompass all such modification and equivalent structures and functions.

This application claims the benefit of Japanese Patent Application No. 2012-164688, filed on Jul. 25, 2012, which is hereby incorporated by reference herein in its entirety.

What is claimed is:

1. A method of manufacturing a liquid ejection head by forming an ejection port forming member for configuring an ejection port for ejecting liquid by using a photosensitive resin layer on a surface of a substrate, the method comprising:
   (1) a step of forming a dent representing a substantially spherical profile in a region including the position for forming the ejection port on a surface of the photosensitive resin layer;
   (2) a step of forming a latent image corresponding to the ejection port in the dent by way of an exposure treatment using a projection lens system; and
   (3) a step of producing the ejection port by developing the latent image;
   the latent image being formed by a beam of exposure light refracted by the projection lens system and inclined from the direction perpendicular to the surface of the substrate in the exposure treatment in the above-described step (2);
   the center of a top surface of the latent image being shifted to the incoming side of the beam of exposure light from the lowest point of the dent.

2. The method according to claim 1, wherein
   the top surface of the latent image is arranged so as to include the lowest point of the dent.

3. The method according to claim 2, wherein
   the latent image has a lateral surface so as to form equal angles with the surface of the substrate at the transversal opposite ends of the lateral surface in a cross section taken along a plane that passes through the center of the top surface of the latent image and the lowest point of the dent and stands perpendicularly relative to the surface of the substrate.

4. The method according to claim 2, wherein:
   the ejection port forming member has a plurality of ejection ports arranged in a row so as to respectively correspond to a plurality of ejection energy generating elements formed in the surface of the substrate; and
   a plurality of dents are formed so as to respectively correspond to the plurality of ejection ports in the step (1); while
   a plurality of latent images are formed collectively so as to respectively correspond to the plurality of ejection ports in the exposure treatment in the step (2); and
   the center of the top surface of the latent image of each of the ejection ports located at and near the ends of the row of ejection ports is shifted to the incoming side of the beam of exposure light from the lowest point of the dent to an extent that corresponds to the incident angle of the beam of exposure light from the direction perpendicular to the surface of the substrate.

5. The method according to claim 4, wherein the lowest point of each of the dents is shifted toward the center of the row of ejection ports from the center of the corresponding ejection port.

6. The method according to claim 1, wherein the latent image has a lateral surface so as to form equal angles with the surface of the substrate at the transversal opposite ends of the lateral surface in a cross section taken along a plane that passes through the center of the top surface of the latent image and the lowest point of the dent and stands perpendicularly relative to the surface of the substrate.

7. The method according to claim 6, wherein the ejection port forming member has a plurality of ejection ports arranged in a row so as to respectively correspond to a plurality of ejection energy generating elements formed in the surface of the substrate; and
a plurality of dents are formed so as to respectively correspond to the plurality of ejection ports in the step (1); while
a plurality of latent images are formed collectively so as to respectively correspond to the plurality of ejection ports in the exposure treatment in the step (2); and
the center of the top surface of the latent image of each of the ejection ports located at and near the ends of the row of ejection ports is shifted to the incoming side of the beam of exposure light from the lowest point of the dent to an extent that corresponds to the incident angle of the beam of exposure light from the direction perpendicular to the surface of the substrate.

8. The method according to claim 7, wherein the lowest point of each of the dents is shifted toward the center of the row of ejection ports from the center of the corresponding ejection port.

9. The method according to claim 1, wherein:
the ejection port forming member has a plurality of ejection ports arranged in a row so as to respectively correspond to a plurality of ejection energy generating elements formed in the surface of the substrate; and
a plurality of dents are formed so as to respectively correspond to the plurality of ejection ports in the step (1); while
a plurality of latent images are formed collectively so as to respectively correspond to the plurality of ejection ports in the exposure treatment in the step (2); and
the center of the top surface of the latent image of each of the ejection ports located at and near the ends of the row of ejection ports is shifted to the incoming side of the beam of exposure light from the lowest point of the dent to an extent that corresponds to the incident angle of the beam of exposure light from the direction perpendicular to the surface of the substrate.

10. The method according to claim 9, wherein the lowest point of each of the dents is shifted toward the center of the row of ejection ports from the center of the corresponding ejection port.

11. The method according to claim 10, wherein the plurality of ejection ports have the same positional relationship relative to the corresponding respective ejection energy generating elements.

12. The method according to claim 9, wherein the plurality of ejection ports have the same positional relationship relative to the corresponding respective ejection energy generating elements.

* * * * *